(12) United States Patent
Zhang et al.

(10) Patent No.: US 7,928,719 B2
(45) Date of Patent: Apr. 19, 2011

(54) ZERO CURRENT DETECTOR FOR A DC-DC CONVERTER

(75) Inventors: Haibo Zhang, ShenZhen (CN); Ligang Jia, ShenZhen (CN)

(73) Assignee: Shenzhen STS Microelectronics Co., Ltd., Shenzhen (CN)

( * ) Notice: Subject to any disclaimer, the term of this patent is extended or adjusted under 35 U.S.C. 154(b) by 312 days.

(21) Appl. No.: 11/970,435

(22) Filed: Jan. 7, 2008

(65) Prior Publication Data

US 2009/0174391 A1    Jul. 9, 2009

(51) Int. Cl.
*G01R 19/00* (2006.01)
(52) U.S. Cl. ............ 324/76.11; 323/265; 323/271; 323/282; 323/319
(58) Field of Classification Search .......... 324/76.11
See application file for complete search history.

(56) References Cited

U.S. PATENT DOCUMENTS

| | | | | |
|---|---|---|---|---|
| 5,095,224 A * | 3/1992 | Renger | ............ | 327/110 |
| 5,341,086 A * | 8/1994 | Fukudome | ............ | 323/273 |
| 6,081,075 A * | 6/2000 | Littlefield | ............ | 315/209 R |
| 6,097,229 A * | 8/2000 | Hinterscher | ............ | 327/199 |
| 6,507,175 B2 * | 1/2003 | Susak et al. | ............ | 323/235 |
| 6,828,766 B2 * | 12/2004 | Corva et al. | ............ | 323/284 |
| 7,042,280 B1 * | 5/2006 | Huang et al. | ............ | 327/541 |
| 2003/0102850 A1 * | 6/2003 | Susak et al. | ............ | 323/247 |
| 2004/0257095 A1 * | 12/2004 | Yang | ............ | 324/713 |
| 2005/0046405 A1 * | 3/2005 | Trafton et al. | ............ | 323/308 |
| 2005/0206441 A1 * | 9/2005 | Kimura | ............ | 327/536 |
| 2008/0100378 A1 * | 5/2008 | Bernacchia | ............ | 327/589 |
| 2008/0164914 A1 * | 7/2008 | Bayadroun | ............ | 327/72 |

* cited by examiner

*Primary Examiner* — Timothy J Dole
*Assistant Examiner* — Benjamin M Baldridge
(74) *Attorney, Agent, or Firm* — Lisa K. Jorgenson; William J. Kubida

(57) ABSTRACT

A zero current detector for a DC-DC converter includes a first transistor having a drain, a gate, and a source for sensing the voltage of a first terminal of a power transistor; a second transistor having a drain, a gate, and a source for sensing the voltage of a second terminal of a power transistor; and a third transistor having a coupled gate and drain for receiving a reference current that is coupled to the gates of the first and second transistors and a source coupled to the source of the first transistor, wherein an output signal is provided by the drains of the first and second transistors. A load is coupled to the drains of the first and second transistors. The zero current detector also includes a fourth transistor having a current path coupled between the source of the second transistor and the second terminal of the power transistor and a gate for receiving a control signal.

21 Claims, 5 Drawing Sheets

PROPOSED IMPLEMENTATION FOR DMD

CONVENTIONAL IMPLEMENTATION

PROPOSED IMPLEMENTATION FOR DMD

PROPOSED IMPLEMENTATION IN BOOST CONVERTOR

PROPOSED IMPLEMENTATION FOR DMD

PROPOSED IMPLEMENTATION IN BOOST CONVERTOR

US 7,928,719 B2

ZERO CURRENT DETECTOR FOR A DC-DC CONVERTER

BACKGROUND OF THE INVENTION

The present invention is related to a zero current detector and, more particularly, for a zero current detector using the sources of transistors in the design to sense the voltage of a power transistor for use in a DC-DC converter application.

A classical implementation of a zero current detector according to the prior art is shown in FIGS. 1(a) and 1(b). A first typical implementation of a zero current detector is illustrated in FIG. 1(a) including P-channel transistors M1 and M2, resistor R1, current source I1, and N-channel diode-connected load devices M3 and M4. The state of the COMPARE signal is indicative of the direction of the current flowing through the power transistor M0. Note that the gates of transistors M1 and M2 are used to monitor terminals "A" and "B" of power device M0. The voltage on the gate of transistor M1 is designated INM and the voltage on the gate of transistor M2 is designated INP. In FIG. 1(a), Id=(Vgs2−Vgs1+I1*R1/2)/Rdson. The circuit of FIG. 1(a) is relatively easy to implement, but the accuracy is not ideal because of the mismatching of the R1 resistor value and the CMOS body effect acting upon power transistor M0. Moreover, the circuit of FIG. 1(a) cannot be used in a high voltage application. In FIG. 1(b), the accuracy of the circuit is improved due to the addition of N-channel transistor M5 and the IBIAS current source as well as removing resistor R1, but the transient response is slow because the voltage on node C must be discharged from VCC to the voltage on node B. The circuit of FIG. 1(b) is also not suitable for high voltage applications.

What is desired, therefore, is a zero current detector having high sense accuracy and high transient response, able to be used in extensive different applications, yet easy to implement.

SUMMARY OF THE INVENTION

According to a first embodiment of the present invention a zero current detector for a DC-DC converter includes a first transistor having a drain, a gate, and a source for sensing the voltage of a first terminal of a power transistor; a second transistor having a drain, a gate, and a source for sensing the voltage of a second terminal of a power transistor; and a third transistor having a coupled gate and drain for receiving a reference current that is coupled to the gates of the first and second transistors and a source coupled to the source of the first transistor, wherein an output signal is provided by the drains of the first and second transistors. An optional voltage-limiting diode is coupled between the source of the first transistor and the source of the second transistor. A load is coupled to the drains of the first and second transistors. The zero current detector also includes a fourth transistor having a current path coupled between the source of the second transistor and the second terminal of the power transistor and a gate for receiving a control signal.

According to a second embodiment of the present invention a zero current detector for a DC-DC converter includes a first transistor having a drain, a gate, and a source for sensing the voltage of a first terminal of a power transistor; a second transistor having a drain, a gate, and a source for sensing the voltage of a second terminal of a power transistor; a third transistor having a coupled gate and drain coupled to the gates of the first and second transistors and a source coupled to the source of the first transistor; a fourth transistor having a source coupled to the drain of the first transistor, a gate, and a drain; a fifth transistor having a source coupled to the drain of the second transistor; and a sixth transistor having a coupled gate and drain for receiving a reference current that is coupled to the gates of the fourth and fifth transistors; wherein an output signal is provided by the drains of the first and second transistors. An optional voltage-limiting diode is coupled between the source of the first transistor and the source of the second transistor. A load is coupled to the drain of the fourth and fifth transistors through a bias stage. The zero current detector also includes a seventh transistor having a current path coupled between the source of the second transistor and the second terminal of the power transistor and a gate for receiving a control signal.

The foregoing and other objects, features and advantages of the invention will become more readily apparent from the following detailed description of a preferred embodiment of the invention, which proceeds with reference to the accompanying drawings.

DETAILED DESCRIPTION

Figure 2:
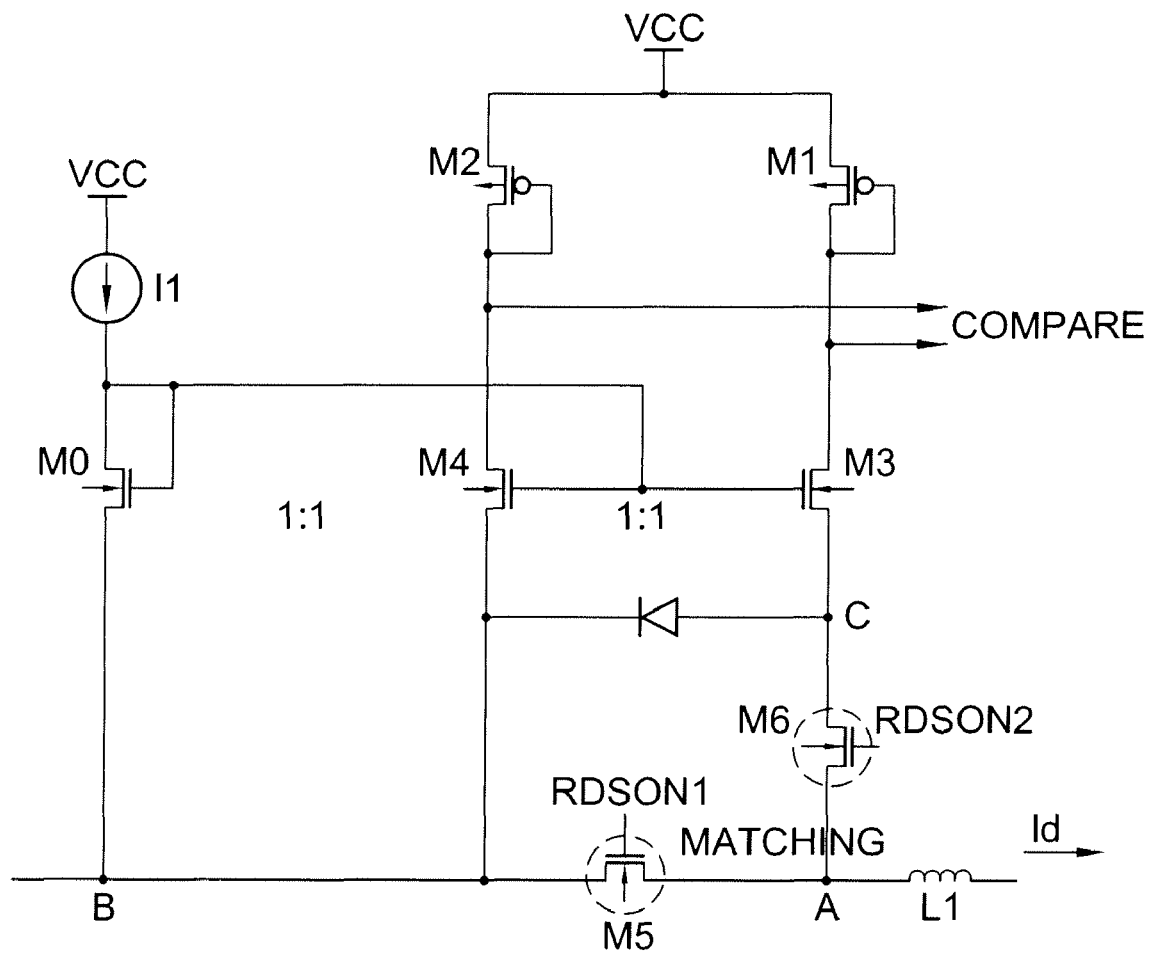
FIG. 2 is a schematic diagram of a first embodiment of a zero current detector according to the present invention.

The zero detect circuit according to a first embodiment of the invention is shown in FIG. 2. The circuit of FIG. 2 includes N-channel transistors M0, M4, and M3, which have coupled gates. The coupled gate and drain of transistor M0 receives the I1 reference current. Note that the sources of transistors M3 and M4 are used to sense the voltage at nodes "A" and "B" of power transistor M5. The current flowing through power transistor M5 also flows through inductor L1. The source of transistor M0 is also coupled to node "B". An optional diode is coupled between the sources of transistors M3 and M4 to limit damaging voltage transients. Diode-connected P-channel transistors M1 and M2 serve as load devices for providing the output COMPARE voltage, the state of which is indicative of the direction of the current flowing through transistor M5 and inductor L1. A matching transistor M6 is provided between nodes "A" and "C" to match the voltage across power transistor M5. The gate control voltages for transistors M5 and M6 are explained in greater detail below.

The circuit shown in FIG. 2 uses the sources of N-channel transistors M3 and M4 to sense the voltage of power MOS transistor M5 instead of the gates as is shown in the prior art implementations of FIGS. 1(a) and 1(b). The circuit of FIG. 2 increases the accuracy of detection and the transient response performance. The circuit of FIG. 2 can also be used in extensive different applications such as high voltage, buck, boost and buck-boost converter applications.

In FIG. 2:

$$Id=(Vgs3-Vgs4+I1*Rdson2)/Rdson1=I1*Rdson2/Rdson1, (Id>>I1)$$

As a result, the relationship between the discontinuous mode current Id and the reference current I1 does not depend on the exact values of the resisters Rdson1 and Rdson2, but on their ratio, which can be easily controlled with analog layout techniques. Thus the accuracy is improved. On the other hand, the voltage on node C is clamped during M5 and M6 switching on and off.

When transistors M5 and M6 are on:

$$Vc=Vgs4-Vgs3+Id*Rdson1-Is3*Rdson2,$$

where Is3 is the current of transistor M3.

When M5 and M6 are on:

$$Vc=Vb+Vbe$$

As a result, the transient response is faster during power MOS switching than the transient response of the conventional zero current detect circuits.

Furthermore, using the sources of N-channel transistors M3 and M4 in the circuit of FIG. 2 of the present invention to sense the voltage of the power MOS transistor M5 instead of gates leads to easy implementation for a high voltage application. For example, assume that the voltage on node A is a high voltage and the voltage on node B is ground (such as in a Buck DC-DC converter application). Transistor M5 is a power switch and transistor M6 is a switch matching transistor M5. The circuit shown in FIG. 2 can be used at high voltages but the circuit shown in prior art FIGS. 1(a) and 1(b) cannot.

Figure 3:
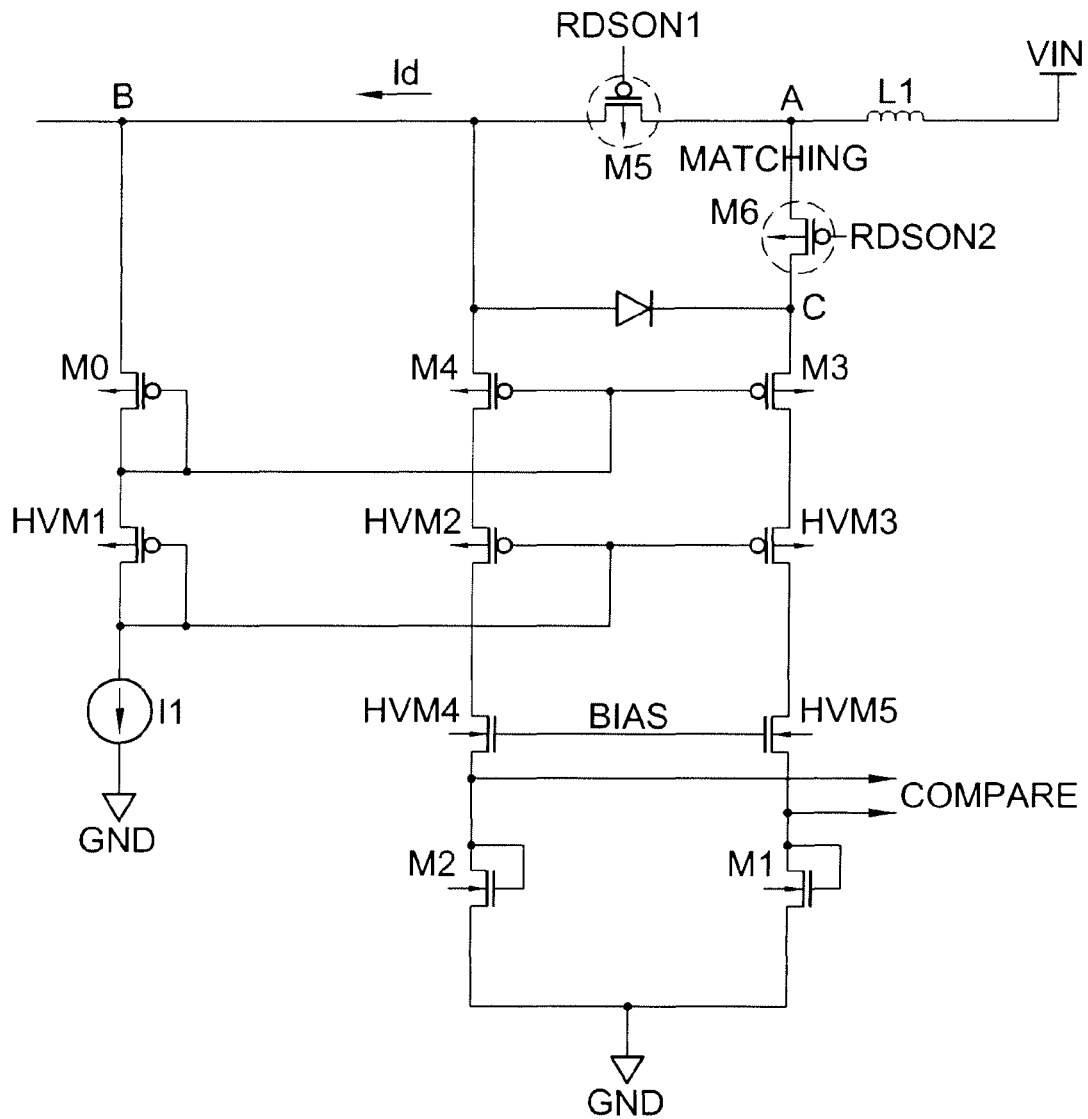
FIG. 3 is a schematic diagram of a second embodiment of a zero current detector according to the present invention.

Referring now to FIG. 3, a schematic diagram of a second embodiment of the present invention is shown. The circuit of FIG. 3 can be used in Boost DC-DC converter applications as shown. Nodes A and B are high voltage nodes. The circuit of FIG. 3 uses the sources of transistors M3 and M4 to sense the voltage of power transistor M5. The operation of the circuit of FIG. 3 is substantially the same as in FIG. 2 with respect to transistors M0, M3, M4, M5, M6, and load devices M1 and M2. However, the polarity of the transistors has been changed for the application of FIG. 3. Note that transistors M0, M3, and M4 are all P-channel transistors. In addition, for the Boost DC-DC converter application an additional stage includes high voltage P-channel transistors HVM1, HVM2, and HVM3 as shown. In the circuit of FIG. 3, the coupled gate and drain of transistor HVM1 receives the I1 reference current, and the source thereof is coupled to the coupled gate and drain of transistor M0. The gate of high voltage transistor HVM1 is coupled to the gates of high voltage transistors HVM2 and HVM3. The source of high voltage transistor HVM2 is coupled to the drain of transistor M4. The source of high voltage transistor HVM3 is coupled to the drain of transistor M3. The drain of high voltage transistor HVM2 is coupled to load device M2 through bias stage N-channel transistor HVM4. The drain of high voltage transistor HVM3 is coupled to load device M1 through bias stage N-channel transistor HVM5. The gates of bias stage transistors HVM4 and HVM5 are coupled to an appropriate BIAS voltage suitable for the Boost DC-DC converter application.

Figure 1:
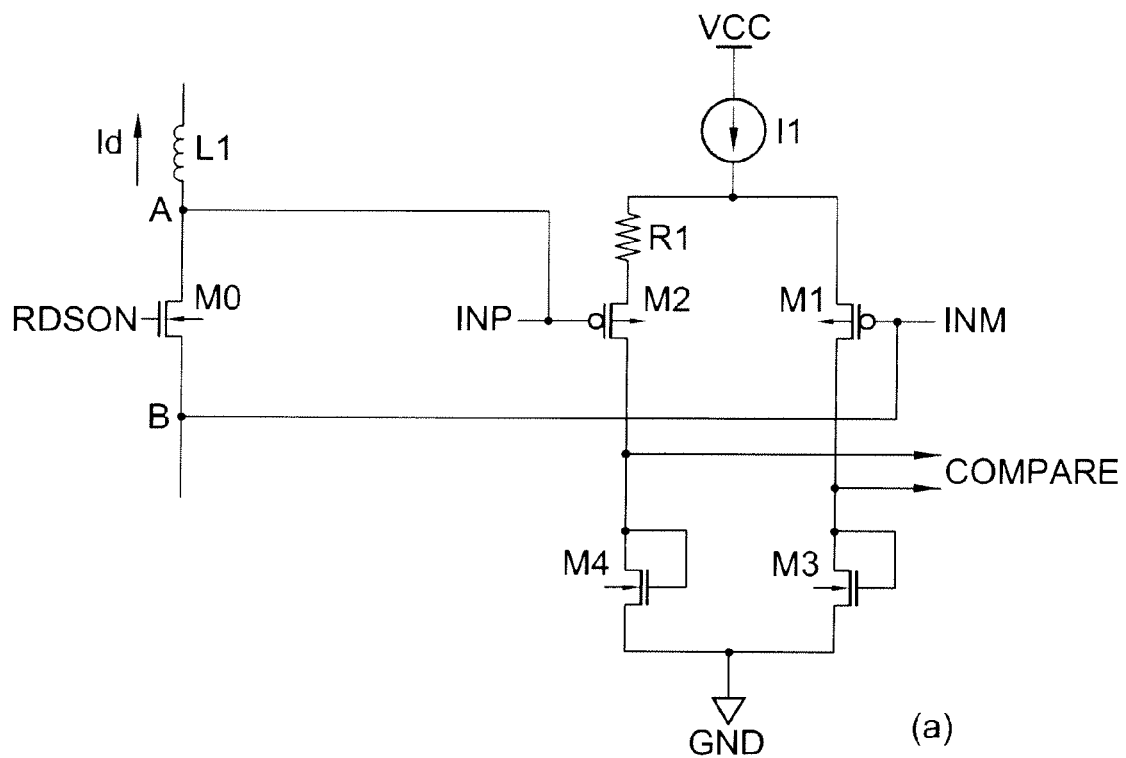
FIG. 1(a) is a schematic diagram of a first zero current detector according to the prior art.
FIG. 1(b) is a schematic diagram of a second zero current detector according to the prior art.
Figure 1:
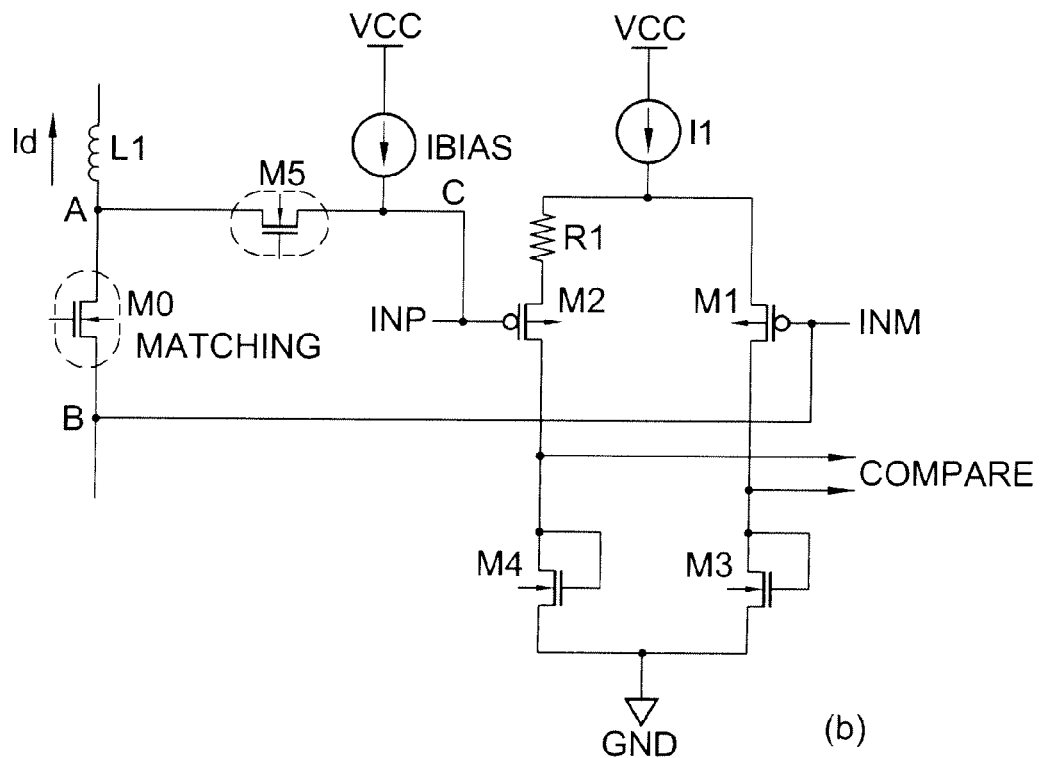

In both of the embodiments of FIGS. 1 and 2 the gates of transistors M5 and M6 are controlled by a control signal that turns on the transistor to conduct current. Transistor M5 conducts current to inductor L1. Transistors M5 and M6 are turned on together. Transistor M6 is part of the sensing circuit and is used to sense the current on M5. The sense accuracy of the zero current detect circuit of the present invention depends on the ratio of turned-on resistance of transistors M6 and M5 so that it is important for transistors M6 and M5 to match.

Figure 4:
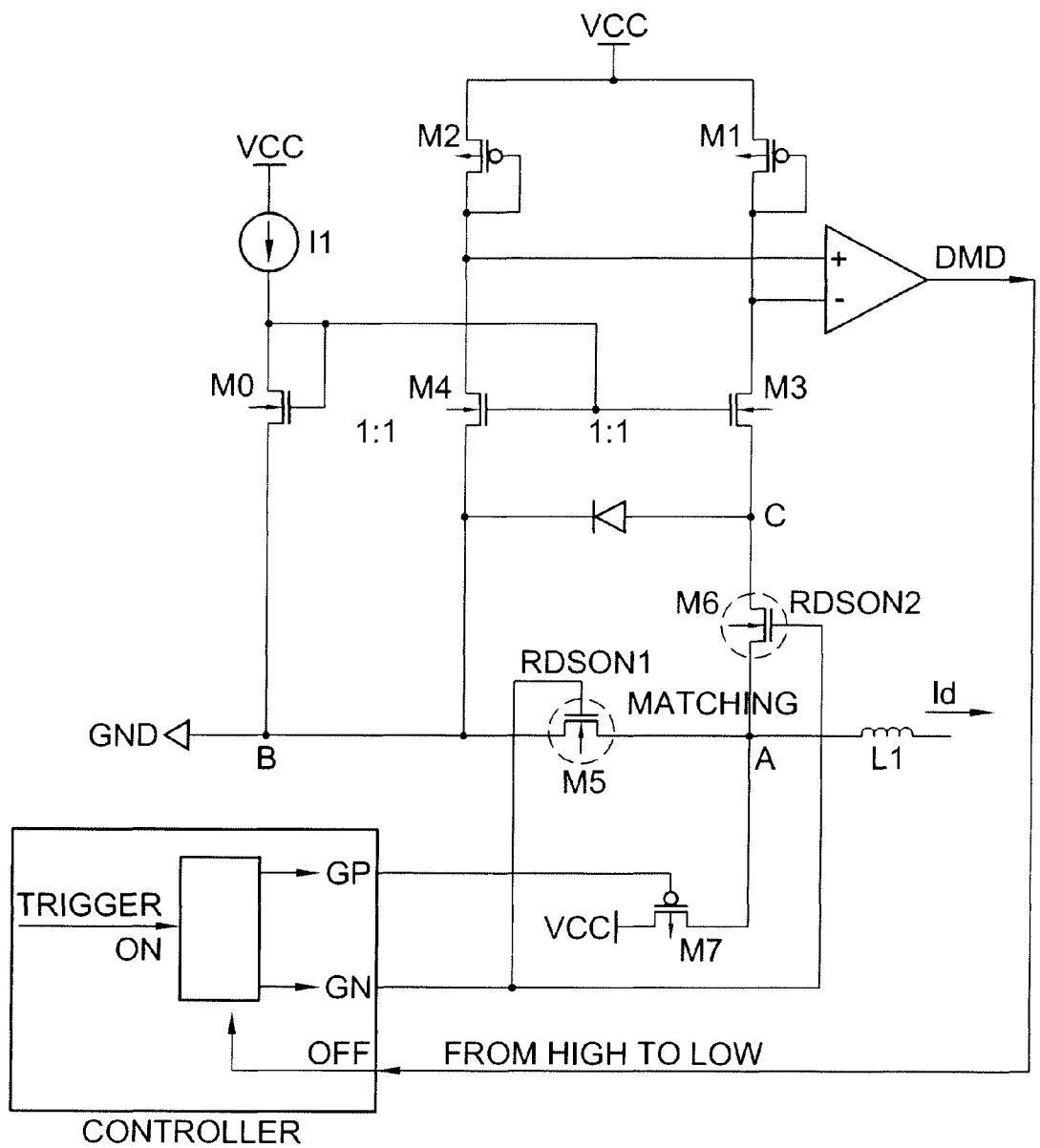
FIG. 4 is a schematic diagram showing further detail of the first embodiment of the present invention.
Figure 5:
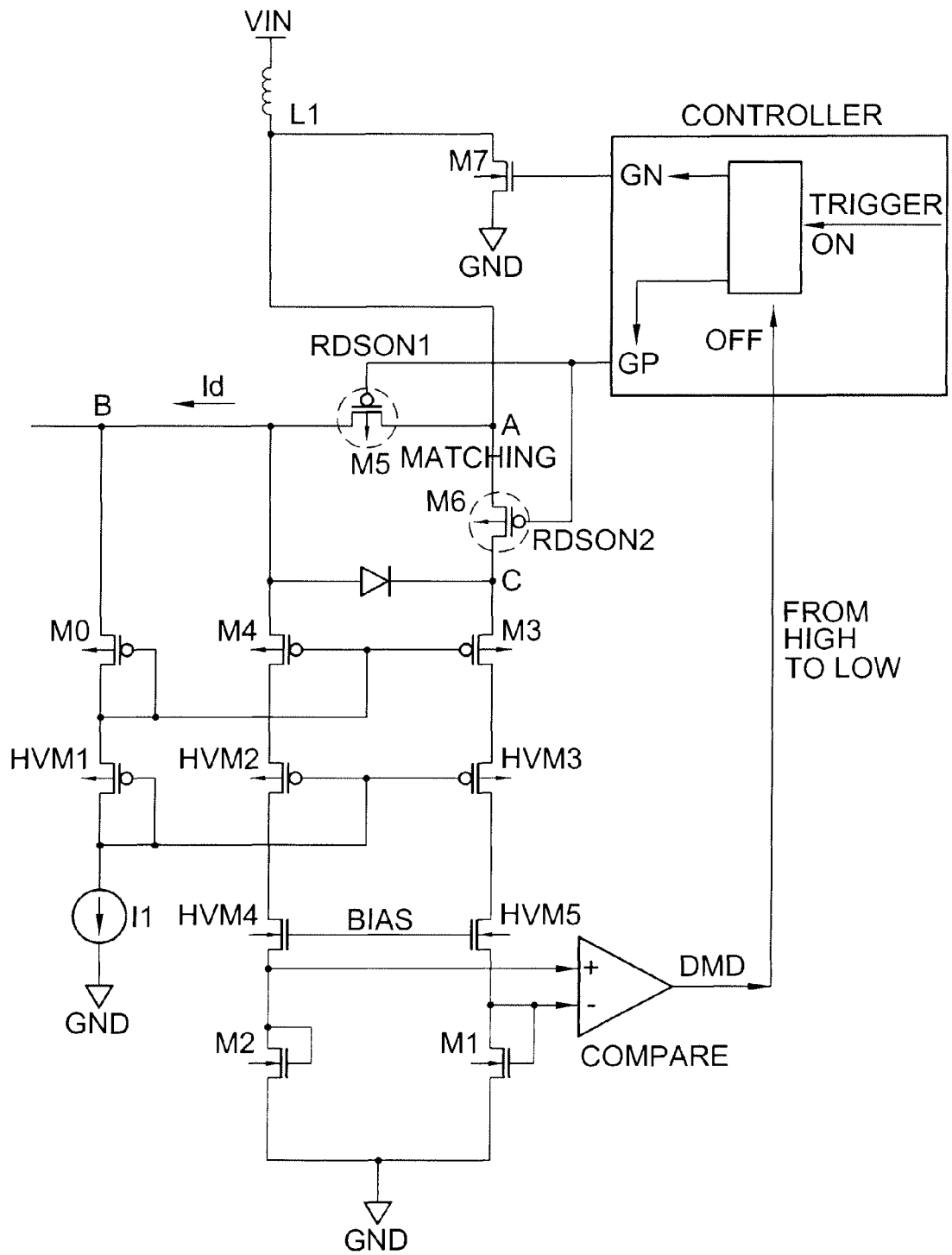
FIG. 5 is a schematic diagram showing further detail of the second embodiment of the present invention.

Further details of the control signal for transistors M5 and M6 are shown in FIGS. 4 and 5, corresponding to the circuits shown in FIGS. 2 and 3, respectively. At an initial time, the CONTROLLER turns on P-channel transistor M7 (current path coupled between node "A" and VCC) and turns off transistors M5 and M6 to conduct current. Subsequently, transistor M7 is turned off and transistor M5 is turned on to continue the current in inductor L1. At the same time, transistor M6 is turned on to sense the current in transistor M5. At first, the current in transistor M5 is larger than the set current (Iset*Rdson2/Rdson1) so that the COMPARATOR puts out a logic HIGH. Once the current in transistor M5 is less than the set current, the COMPARATOR puts out a logic LOW and then the CONTROLLER turns off the transistor M5 immediately in order to avoid the reverse current from nodes "A" to "B" in FIG. 4 and the reverse current from nodes "B" to "A" in FIG. 5. At the same time, transistor M6 is switched off to save power consumption.

Having described and illustrated the principle of the invention in a preferred embodiment thereof, it is appreciated by those having skill in the art that the invention can be modified in arrangement and detail without departing from such principles. Although a preferred method and circuit has been shown, the exact details of the preferred method and circuit can be changed as desired as required for a particular application. We therefore claim all modifications and variations coming within the spirit and scope of the following claims.

We claim:

1. A zero current detector for a DC-DC converter comprising:
  a first transistor having a drain, a gate, and a source for sensing the voltage of a first current terminal of a power transistor of the DC-DC converter;
  a second transistor having a drain, a gate, and a source for sensing the voltage of a second current terminal of the power transistor; and
  a third transistor having a coupled gate and drain for receiving a reference current that is coupled to the gates of the first and second transistors and a source coupled to the source of the first transistor,
  wherein an output signal indicating a detected zero current condition is provided by the drains of the first and second transistors and wherein the sources of the first and second transistors are separately used for sensing voltage at the first and second terminals, respectively, of the power transistor.

2. The zero current detector of claim 1 further comprising a diode coupled between the source of the first transistor and the source of the second transistor.

3. The zero current detector of claim 1 further comprising a load coupled to the drain of the first transistor.

4. The zero current detector of claim 3 wherein the load comprises a diode-connected transistor.

5. The zero current detector of claim 1 further comprising a load coupled to the drain of the second transistor.

6. The zero current detector of claim 5 wherein the load comprises a diode-connected transistor.

7. The zero current detector of claim 1 further comprising a fourth transistor having a current path coupled between the source of the second transistor and the second current terminal of the power transistor.

8. The zero current detector of claim 7 wherein the fourth transistor includes a gate for receiving a control signal.

9. The zero current detector of claim 7 wherein the fourth transistor comprises an N-channel transistor.

10. The zero current detector of claim 1 wherein the first, second, and third transistors each comprise an N-channel transistor.

11. A zero current detector for a DC-DC converter comprising:
- a first transistor having a drain, a gate, and a source for sensing the voltage of a first current terminal of a power transistor of the DC-DC converter;
- a second transistor having a drain, a gate, and a source for sensing the voltage of a second current terminal of the power transistor;
- a third transistor having a coupled gate and drain coupled to the gates of the first and second transistors and a source coupled to the source of the first transistor;
- a fourth transistor having a source coupled to the drain of the first transistor, a gate, and a drain;
- a fifth transistor having a source coupled to the drain of the second transistor; and
- a sixth transistor having a coupled gate and drain for receiving a reference current that is coupled to the gates of the fourth and fifth transistors;
- wherein an output signal indicating a detected zero current condition is provided by the drains of the first and second transistors and wherein the sources of the first and second transistors are separately used for sensing voltages at the first and second terminals, respectively, of the power transistor.

12. The zero current detector of claim 11 further comprising a diode coupled between the source of the first transistor and the source of the second transistor.

13. The zero current detector of claim 11 further comprising a load coupled to the drain of the fourth transistor through a bias stage.

14. The zero current detector of claim 13 wherein the load comprises a diode-connected transistor.

15. The zero current detector of claim 11 further comprising a load coupled to the drain of the fifth transistor through a bias stage.

16. The zero current detector of claim 15 wherein the load comprises a diode-connected transistor.

17. The zero current detector of claim 11 further comprising a seventh transistor having a current path coupled between the source of the second transistor and the second current terminal of the power transistor.

18. The zero current detector of claim 17 wherein the seventh transistor includes a gate for receiving a control signal.

19. The zero current detector of claim 17 wherein the seventh transistor comprises a P-channel transistor.

20. The zero current detector of claim 11 wherein the first, second, third, fourth, fifth, and sixth transistors each comprise a P-channel transistor.

21. A zero current detecting method for a DC-DC converter comprising:
- providing a first transistor having a source coupled to a first current terminal of a power transistor of the DC-DC converter, a gate, and a drain;
- providing a second transistor having a source coupled to a second current terminal of the power transistor of the DC-DC converter, a gate, and a drain;
- biasing the gates of the first and second transistors;
- providing an output signal at the drains of the first and second transistors indicating a detected zero current condition; and
- using the sources of the first and second transistors separately for sensing voltages at the first and second terminals, respectively, of the power transistor.

* * * * *